(12) United States Patent
Tsai et al.

(10) Patent No.: US 6,894,323 B2
(45) Date of Patent: May 17, 2005

(54) GROUP III NITRIDE SEMICONDUCTOR DEVICE AND ITS METHOD OF MANUFACTURE

(75) Inventors: Tzong-Liang Tsai, Hsinchu (TW); Chih-Sung Chang, Hsinchu (TW)

(73) Assignee: United Epitaxy Company, Ltd., Hsinchu (TW)

( * ) Notice: Subject to any disclaimer, the term of this patent is extended or adjusted under 35 U.S.C. 154(b) by 0 days.

(21) Appl. No.: 10/791,710

(22) Filed: Mar. 4, 2004

(65) Prior Publication Data

US 2005/0082563 A1 Apr. 21, 2005

(30) Foreign Application Priority Data

Oct. 20, 2003 (TW) ........................................ 92129057 A

(51) Int. Cl.[7] ................ H01L 31/0328; H01L 31/0336; H01L 31/072; H01L 31/109
(52) U.S. Cl. ...................................... 257/190; 257/103
(58) Field of Search .................................. 257/190, 103

(56) References Cited

U.S. PATENT DOCUMENTS 6,391,748 B1 * 5/2002 Temkin et al. .............. 438/478
6,524,932 B1 * 2/2003 Zhang et al. ............... 438/459

* cited by examiner

Primary Examiner—David Nelms
Assistant Examiner—Tu-Tu Ho
(74) Attorney, Agent, or Firm—Winston Hsu

(57) ABSTRACT

Disclosed is a Group III nitride semiconductor device comprising a stress-absorbing layer having: an amorphous silicon nitride layer, an aluminum interlayer, an amorphous aluminum nitride pre-layer and a polycrystalline Group III nitride layer containing aluminum. The stress-absorbing layer is located between a silicon substrate and a Group III nitride semiconductor, for alleviating stress resulted from different lattice constants between the Group III nitride substance and the silicon substrate, thereby preventing cracking of the Group III nitride semiconductor due to the stress. Further disclosed is a method of manufacturing Group III nitride semiconductor device.

38 Claims, 6 Drawing Sheets

GROUP III NITRIDE SEMICONDUCTOR DEVICE AND ITS METHOD OF MANUFACTURE

CROSS-REFERENCES TO RELATED APPLICATIONS

Not Applicable

STATEMENT REGARDING FEDERALLY SPONSORED RESEARCH OR DEVELOPMENT

Not Applicable

DESCRIPTION

1. Field of Invention

This invention relates to a Group III nitride semiconductor device and its method of manufacture, particularly to one implementing a stress-absorbing layer located between a silicon substrate and a Group III nitride semiconductor to alleviate stress resulted from different lattice constants between the Group III nitride substance and the silicon substrate, thereby preventing cracking of the Group III nitride semiconductor due to the stress.

2. Background

The processes for depositing high-quality GaN-based compound film are generally categorized into two types. One implements the metal-organic chemical vapor deposit (MOCVD) process or plasma-enhanced MOCVD process, which is a modification of MOCVD, and is characterized by the use of a representative reactor pressure of 10–1030 hPa and a growth temperature of 500–1100° C. to deposit high-quality GaN. The measures for controlling the growth of GaN include vapor chemical reactions and chemical reactions between the substrate surfaces or semiconductor film surfaces. Another implements the molecular beam epitaxy (MBE) process, gaseous source molecular beam epitaxy (GSMBE) process, chemical beam epitaxy (CBE) process, metal-organic molecular beam epitaxy (MOMBE) process or relevant processes, and differs from the prior type in the absence of a reactor pressure below 0.001 hPa and the vapor reactions.

FIG. 1 is a schematic view illustrating a MOCVD process. The figure illustrates a sapphire substrate 10, a reactor 11, a base 12, a heater 13, a reaction gas injection tube 14, an auxiliary injection tube 15, a drainage pump 16, a motor 17 and a drainage tube 18. A GaN epitaxy layer of 4 micrometers thick is grown on the sapphire substrate 10 by adopting the following procedures. First, by maintaining the reactor 11 at a pressure of 1030 hPa, a clean sapphire substrate 10 having a diameter of 2 inches is placed on the base 12. The drainage pump 16 is activated to drain air inside the stainless reactor 11. Then, $H_2$ gas is introduced into the reactor 11 to replaced air inside the reactor 11 with the $H_2$ gas. At the same time that $H_2$ gas is supplied into reactor 11 by means of the reaction gas injection tube 14 and the auxiliary injection tube 15 located on a top of the reactor 11, the heater 13 located beneath the base 12 heats the reactor 11 to a temperature of 1060° C. The reactor 11 is held at such a condition for 10 min for removing an oxide film from a surface of the sapphire substrate 10. Then, the base 12 is reduced to a temperature of 500° C. Upon stabilization of the temperature of the sapphire substrate 10, a gas mixture containing $H_2$ and $N_2$ is then injected through the auxiliary injection tube 15 and a gas mixture containing $NH_3$ and $H_2$ is then supplied through the reaction gas injection tube 14. $H_2$ and $N_2$ fluxes are each supplied by the auxiliary injection tube 15 at a flow rate of 10 l/min. $NH_3$ and $H_2$ fluxes are supplied by the reaction gas injection tube 14 at a flow rate of 4 l/min and 1 l/min, respectively. The reactor 11 is held at such a condition until the temperature of the base 12 becomes stable at 500° C. A buffer layer is then formed by adopting the following procedures. Other than supplying $NH_3$ and $H_2$ through the reaction gas injection tube 14, a trimethylgallium (TMG) gas is supplied at a flow rate of 2.7×10−5 mole/min for 1 min to grow a buffer layer of 0.02 micrometers thick. The TMG gas is then ceased from being supplied into the reactor 11 while continuing supplying the remaining gases. The temperature of the base 12 is then increased to 1020° C. At this time, the TMG gas is supplied into the reactor 11 at a flow rate of 5.4×10−5 mole/min for 60 min to cause the GaN epitaxy layer growing into a film of 4.0 micrometers thick.

In the above process, the continuous supply of $H_2$ and $N_2$ gases through the auxiliary injection tube 15 helps to prevent contamination of the reaction gases by the reactor 11 interior. At the same time, power is supplied by the motor 17 to rotate the base 12 at a speed of 5 rpm so as to ensure steady growth of the crystals. At the same time that the gases are supplied to the reactor, the gases as supplied are discharged to the surrounding through the drainage tube 18. The drainage tube 18 is branched off from a fitting of the drainage pump 16. As such, a GaN buffer layer of 0.02 micrometers thick and a GaN epitaxy layer of 4 micrometers thick are deposited on the (with reference to U.S. Pat. No. 5,290,393).

FIG. 2 is a schematic view illustrating a high-speed rotary disc MOCVD reactor for use in a MOCVD process as disclosed in Inst. Phys. Conf. Ser. No 141 (1994) p. 119. The figure illustrates a MOCVD reactor 20, a nitrogen source distributing manifold 21, a Group III distributing manifold 22, an adjusting needle valves 23, a screen mesh 24 and a wafer carrier 25. The MOCVD reactor 20 and the reactor in FIG. 1 differ in the followings. First, all gases are supplied from the top, the Group III gas is supplied by the Group III distributing manifold 22, and the nitrogen source is independent from the Group III source and supplied by the nitrogen source distributing manifold 21. Secondly, the flow distribution of all gases may be controlled by the adjusting needle valves 23, and a uniform hydrogen flux is supplied to a substrate (not shown) placed on the wafer carrier 25 through the screen mesh 24 to grow the desired semiconductor film. Thirdly, to improve film uniformity, the wafer carrier 25 is rotated at a high speed (500–1000 rpm); and the reactor 20 is preferred to be held at a pressure within a range of 76–200 torr (about 1026 hPa). In addition, a high-quality GaN may be grown on a thin GaN buffer layer at a relatively high growing temperature of 1030° C. The GaN buffer layer is deposited by $NH_3$ and TMG at a reactor pressure of 200 Torr (about 26 hPa) under a temperature of 540° C.

FIG. 3 is a schematic view illustrating an MBE chamber using the MBE process to grown a GaN film as disclosed in J. Crystal Growth 150 (1995) p.912. The figure illustrates a highly vacuumed MBE chamber 30, a substrate 31, a gas injector 32, an MBE reactor 33, a reflection high-energy electron device (RHHED) 34, and a substrate heater 35. A GaN layer is grown by the MBE process or relevant process by adopting the following procedures. First, the substrate 31 is introduced into the highly vacuumed MBE chamber 30 and annealed at a high temperature of about 900° C. Then, the substrate 31 is placed in a nitrogen source gas by means of the gas injector 32 and subjected to nitridation. Then, a Ga source beam is introduced to deposit a low temperature buffer layer. The Ga source beam includes an atomized gallium beam from the MBE reactor or an organometallic gallium precursor of triethylgallium (TEG) or TMG introduced from the gas injector 32. Finally, a high-quality GaN layer is deposited under a relatively high growth temperature of 600–860° C. The advantages of such a process resides in that, the RHHED 34 is able to perform in-situ analysis to the film substance. The optimum precursor for nitrogen is $NH_3$ or a mixture of $N_2$ and $NH_3$ The optimum precursor of Ga is TEG or TMG while using a mixture of $N_2$ and $H_2$ as a carrying gas. In other processes relevant to MBE process, plasma from electron circulating resonance, $N_2$ from active reaction by microwave, or $NH_3$ separated by heating may also be adopted to generate nitrogen atomic clusters or atoms.

Further explanations are hereby provided for the structure of the substrate for growing a high-quality GaN-based compound film (with reference to U.S. Pat. No. 5,290,393). Sapphire and SiC wafer are commonly used as the substrates for growing GaN-based compound is common. FIG. 4 illustrates a laminar cross-section of a substrate for growing a high-quality GaN-based compound layer, including a sapphire or SiC wafer 40, a low temperature GaxAl1-xN buffer layer 41, and GaxAl1-xN compound semiconductor layers 42. After cleaning the sapphire or SiC substrate 40 with appropriate processes, an amorphous layer being a GaxAl1-xN ($0 \leq x \leq 1$) low temperature buffer layer 41 with a film thickness of about 10–200 micrometers is deposited on the substrate 40 under a relatively low temperature of 200–700° C., and then converted into a smooth monocrystalline layer. Finally, a GaxAl1-xN ($0 \leq x \leq 1$) compound semiconductor layer 42 having high-quality optical and electrical characteristics is then deposited on the low temperature GaxAl1-xN buffer layer 41 under a relatively high temperature of 700–1150° C.

However, the high-quality GaN grown by adopting the sapphire or SiC substrate involves the following disadvantages. First, the cost of a sapphire wafer dimensioned to 2-inch diameter is about 65–240 US dollars, and the cost of a SiC wafer dimensioned to 1 cm×1 cm is about 200 US dollars, both of which are relatively expensive. Secondly, there is about 3.5% mismatch between the lattice constants of GaN and SiC, and an even greater mismatch between GaN and sapphire, about 16%. Thirdly, as sapphire being an insulating material, electrodes cannot be deposited on a backside of the sapphire substrate, resulting a more expensive process for forming electrodes in subsequent processes. Fourthly, the thermal expansion coefficients of sapphire and GaN differ significantly, resulting in more complicated growing processes. Fifthly, as sapphire being a Wurtzite crystal crystalline structure, other shortcomings arose in manufacturing laser devices. Numerous researches have be exploited to overcome such shortcomings, such as those disclosed in U.S. Pat. Nos. 6,445,009, 6,391,748, 6,218,207, 5,389,571 and 5,239,188. U.S. Pat. No. 5,239,188 exemplifies this matter in further detail as follows. FIG. 5 illustrates a laminar cross-section of a semiconductor device obtained by growing a GaN-based compound semiconductor on a Si substrate. Substrate 53 is an inexpensive n-Si substrate having a low Miller indices. The processes describe previously are adopted to deposit a low temperature AlN buffer layer 54 on the substrate 53. A high-quality n-GaN layer 55 and p-GaN layer 56 are then deposited on the low temperature AlN buffer layer 54 under a relatively high temperature. A p-type electrode 57 and an n-type electrode 58 are lastly formed. Such a structure eliminates the use of expensive substrates and resolves the shortcoming of using sapphire substrates. However, because a monocrystalline GaN layer cannot be smoothly deposited on the Si substrate, most GaN takes the form of GaN crystalline pillars in the shape of hexagonal cones. Secondly, the stress resulted from the different lattice constants between GaN and the silicon substrate would accumulate and cause cracking of the GaN epitaxy layer, as shown in FIG. 6, to cause inability of subsequent manufacturing of devices. Hence, the processing of interface between the GaN and Si becomes an essential feature for ensuring quality of epitaxial laminars.

SUMMARY OF INVENTION

It is, thus, a primary objective of this invention to provide a process for directly forming monocrystalline Group III nitride semiconductor devices on a silicon substrate.

It is another objective of this invention to provide a process implementing a stress-absorbing layer located between a silicon substrate and a Group III nitride semiconductor to alleviate stress resulted from different lattice constants between the Group III nitride substance and the silicon substrate, thereby preventing cracking of the Group III nitride semiconductor due to the stress.

It is a further objective of this invention to provide semiconductor device capable of directly forming a monocrystalline Group III nitride semiconductor device on a silicon substrate.

It is yet a further objective of this invention to provide a Group III nitride semiconductor device implementing a stress-absorbing layer located between a silicon substrate and a Group III nitride semiconductor to alleviate stress resulted from different lattice constants between the Group III nitride substance and the silicon substrate, thereby preventing cracking of the Group III nitride semiconductor due to the stress.

To meet the above objectives, this invention provides a Group III nitride semiconductor device, comprising: a monocrystalline silicon substrate; a stress-absorbing layer located on the silicon substrate, having: a stress-absorbing layer with an amorphous silicon nitride layer deposited on the silicon substrate; an aluminum interlayer deposited on the amorphous silicon nitride layer; an amorphous aluminum nitride pre-layer deposited on the aluminum interlayer; and a polycrystalline Group III nitride layer containing aluminum, deposited on the amorphous aluminum nitride pre-layer; and a monocrystalline Group III nitride semiconductor device laminar structure, deposited on the polycrystalline Group III nitride layer containing aluminum.

According to one aspect of this invention, the monocrystalline silicon substrate is a low resistant silicon substrate.

According to one aspect of this invention, the amorphous silicon nitride layer is made by a nitridation process.

According to one aspect of this invention, the amorphous silicon nitride layer preferably has a thickness of about 3 Å–500 Å, best preferably of about 10 Å–30 Å.

According to one aspect of this invention, the aluminum interlayer has a thickness of about 5 Å–20 Å.

According to one aspect of this invention, the aluminum interlayer and the amorphous silicon nitride layer are formed with an aluminum-nitrogen bond therebetween.

According to one aspect of this invention, the amorphous aluminum nitride pre-layer has a thickness of about 5 Å–500 Å.

According to one aspect of this invention, the amorphous aluminum nitride pre-layer rearranges with the aluminum interlayer during formation to alleviate stress between the amorphous aluminum nitride pre-layer and the silicon substrate.

According to one aspect of this invention, the polycrystalline Group III nitride layer containing aluminum serves to function as a buffer layer of the monocrystalline Group III nitride layer.

According to one aspect of this invention, the semiconductor device is selected from one of the group consisting of: light-emitting diodes, laser diodes, photodiodes, miniature electronic device structures and miniature electromechanical device structures.

According to one aspect of this invention, the monocrystalline Group III nitride semiconductor device laminar structure further comprises: an active layer; a first Group III nitride conductive layer, located between the active layer and the stress-absorbing layer; and a second Group III nitride conductive layer, located on the active layer, having an electrical conductivity different from an electrical conductivity of the Group III nitride conductive layer.

According to one aspect of this invention, the monocrystalline Group III nitride semiconductor device laminar structure further comprises a first electrode, located on the second Group III nitride conductive layer.

According to one aspect of this invention, the first electrode is made by etching part of the Group III nitride conductive layer.

According to one aspect of this invention, the monocrystalline Group III nitride semiconductor device laminar structure further comprises a first electrode, located beneath the silicon substrate.

According to one aspect of this invention, the monocrystalline Group III nitride semiconductor device laminar structure further comprises a transparent electrode, located on the first Group III nitride conductive layer.

According to one aspect of this invention, the monocrystalline Group III nitride semiconductor device laminar structure further comprises a first electrode, located on the transparent electrode.

According to one aspect of this invention, the electrode is made of a material selected from one of the group consisting of: Ti/Al and Ni/Au.

According to one aspect of this invention, the active layer is of a structure selected from one of the group consisting of: homostructure, heterostructure, double-heterostructure, single-quantum well and multiple-quantum micrometers-well.

To meet the above objectives, this invention provides a method of manufacturing a Group III nitride semiconductor device, comprising the steps of: depositing a monocrystalline silicon substrate; depositing a amorphous silicon nitride layer on the silicon substrate; depositing an aluminum interlayer on the amorphous silicon nitride layer; depositing an amorphous aluminum nitride pre-layer on the aluminum interlayer; depositing a polycrystalline Group III nitride layer containing aluminum on the amorphous aluminum nitride pre-layer; and depositing a monocrystalline Group III nitride semiconductor device laminar structure on the polycrystalline Group III nitride layer containing aluminum.

According to one aspect of this invention, the monocrystalline silicon substrate is a low resistant silicon substrate.

According to one aspect of this invention, the amorphous silicon nitride layer is made by a nitridation process.

According to one aspect of this invention, the amorphous silicon nitride layer preferably has a thickness of about 3 Å–500 Å, best preferably of about 10 Å–30 Å.

According to one aspect of this invention, the aluminum interlayer has a thickness of about 5 Å–20 Å.

According to one aspect of this invention, the aluminum interlayer and the amorphous silicon nitride layer are formed with an aluminum-nitrogen bond therebetween.

According to one aspect of this invention, the amorphous aluminum nitride pre-layer has a thickness of about 5 Å–500 Å.

According to one aspect of this invention, the amorphous aluminum nitride pre-layer rearranges with the aluminum interlayer during formation to alleviate stress between the amorphous aluminum nitride pre-layer and the silicon substrate.

According to one aspect of this invention, the polycrystalline Group III nitride layer containing aluminum serves to function as a buffer layer of the monocrystalline Group III nitride layer.

According to one aspect of this invention, the semiconductor device is selected from one of the group consisting of: light-emitting diodes, laser diodes, photodiodes, miniature electronic device structures and miniature electromechanical device structures.

According to one aspect of this invention, the monocrystalline Group III nitride semiconductor device laminar structure is formed by the steps of: depositing an active layer; depositing a first Group III nitride conductive layer located between the active layer and the stress-absorbing layer; and depositing a second Group III nitride conductive layer located on the active layer and having an electrical conductivity different from an electrical conductivity of the Group III nitride conductive layer.

According to one aspect of this invention, the step of depositing the monocrystalline Group III nitride semiconductor device laminar structure further comprises the step of: depositing a first electrode on the second Group III nitride conductive layer.

According to one aspect of this invention, the first electrode is made by etching part of the Group III nitride conductive layer.

According to one aspect of this invention, the step of depositing the monocrystalline Group III nitride semiconductor device laminar structure further comprises the step of: depositing a first electrode beneath the silicon substrate.

According to one aspect of this invention, the step of depositing the monocrystalline Group III nitride semiconductor device laminar structure further comprises the step of: depositing a transparent electrode on the first Group III nitride conductive layer.

According to one aspect of this invention, the step of depositing the monocrystalline Group III nitride semiconductor device laminar structure further comprises the step of: depositing a first electrode on the transparent electrode.

According to one aspect of this invention, the electrode is made of a material selected from one of the group consisting of: Ti/Al and Ni/Au.

According to one aspect of this invention, the active layer is of a structure selected from one of the group consisting of: homostructure, heterostructure, double-heterostructure, single-quantum well and multiple-quantum well.

BRIEF DESCRIPTION OF THE DRAWINGS

These and other modifications and advantages will become even more apparent from the following detained description of a preferred embodiment of the invention and from the drawings in which.

DETAILED DESCRIPTION OF THE INVENTION (PREFERRED EMBODIMENTS)

A few embodiments according to this invention are described in detail are follows. However, these embodiments are provided for exemplification purposes but not to limited the scope of protection. This invention may also be implemented in many other embodiments. The scope of this invention should be determined by the appended claims.

Figure 1:
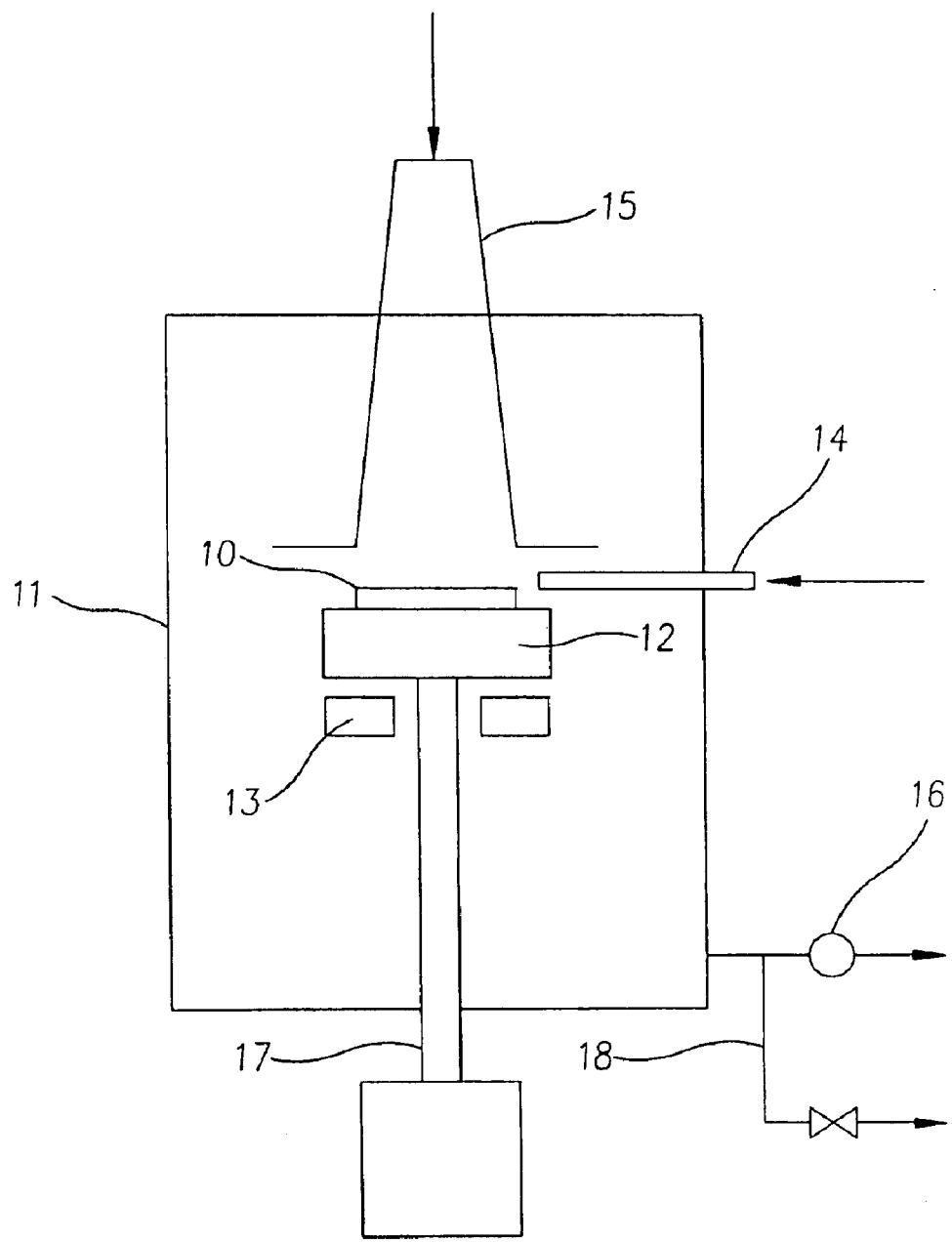
FIG. 1 is a schematic view illustrating a MOCVD process for manufacturing Group III nitride semiconductor devices.
Figure 2:
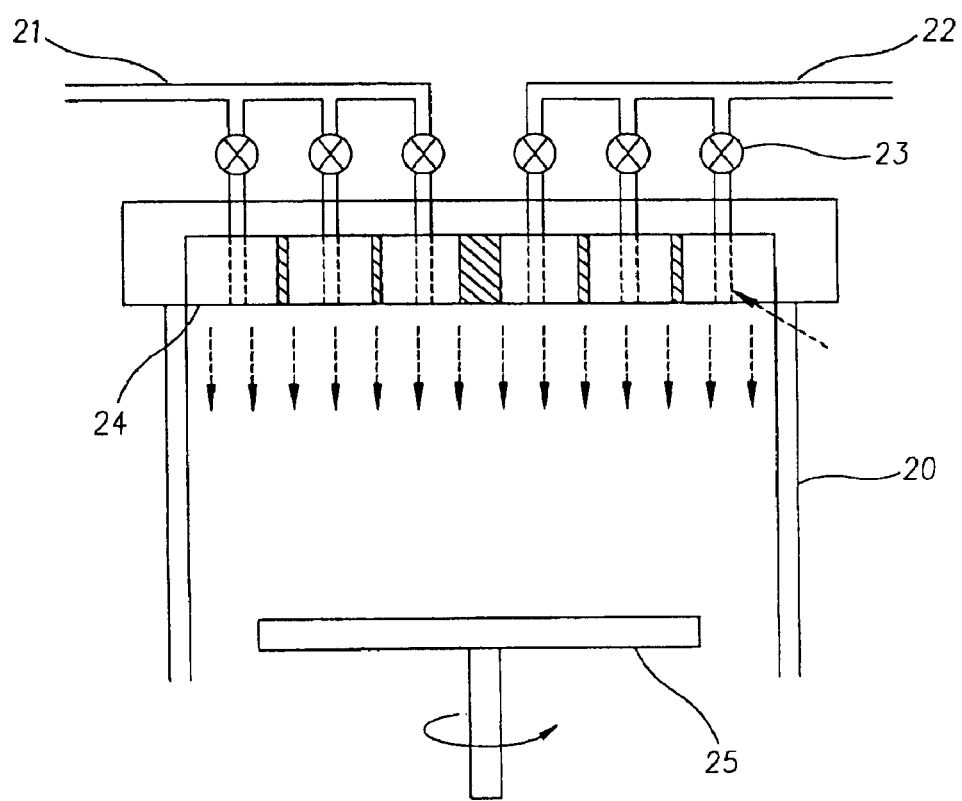
FIG. 2 is a schematic view illustrating another MOCVD process for manufacturing Group III nitride semiconductor devices.
Figure 3:
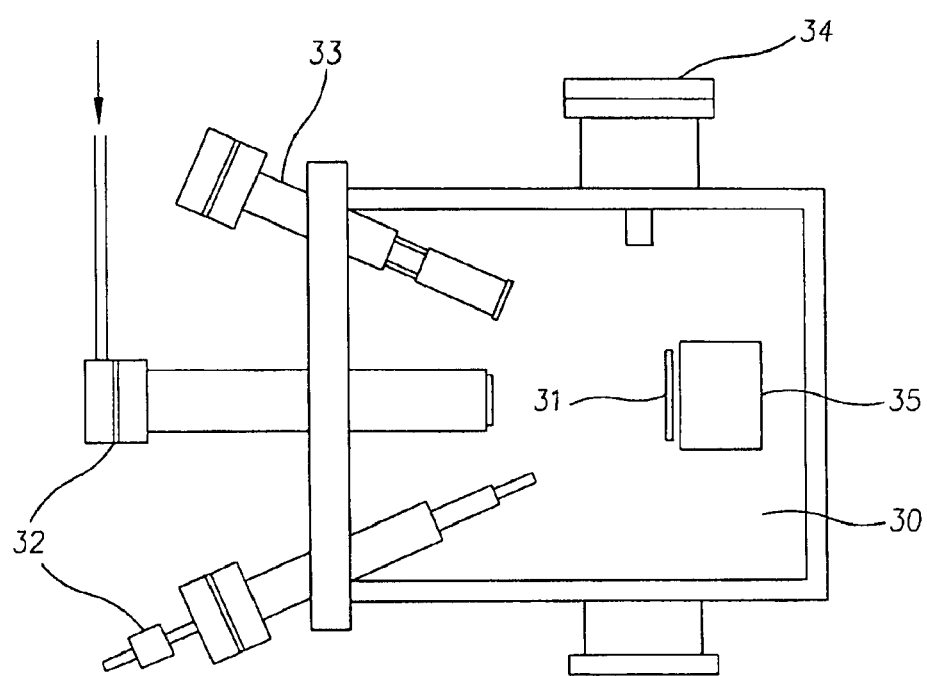
FIG. 3 is a schematic view illustrating an MBE device for manufacturing Group III nitride semiconductor devices.
Figure 4:
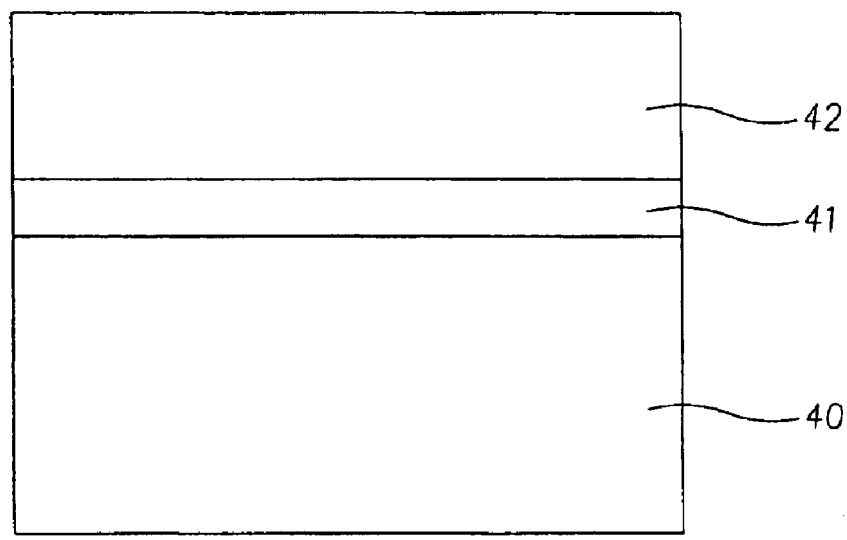
FIG. 4 illustrates a laminar cross-section of a conventional GaN-based compound layer.
Figure 5:
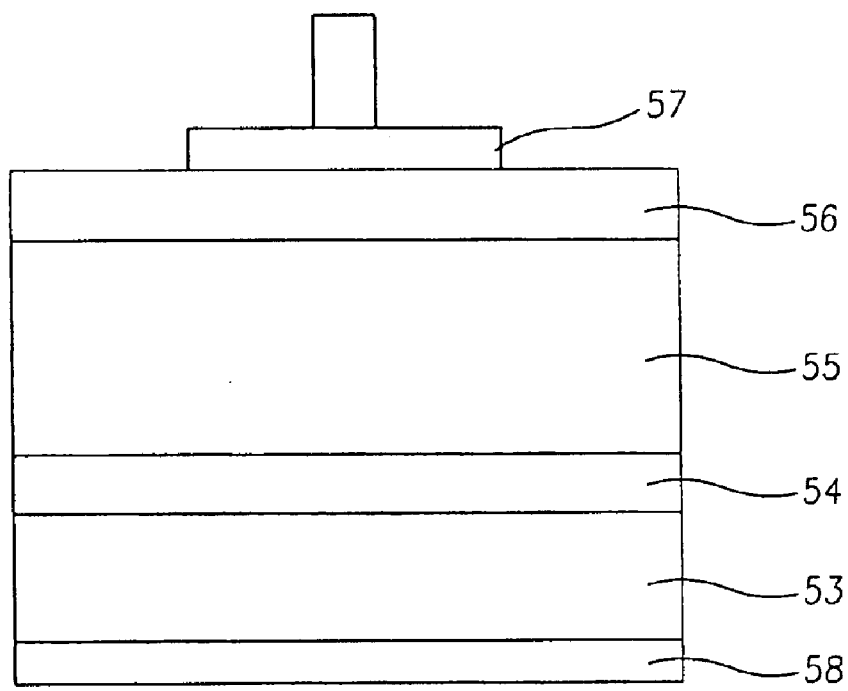
FIG. 5 illustrates a conventional laminar cross-section of a semiconductor device obtained by growing a GaN-based compound semiconductor on a Si substrate.
Figure 6:
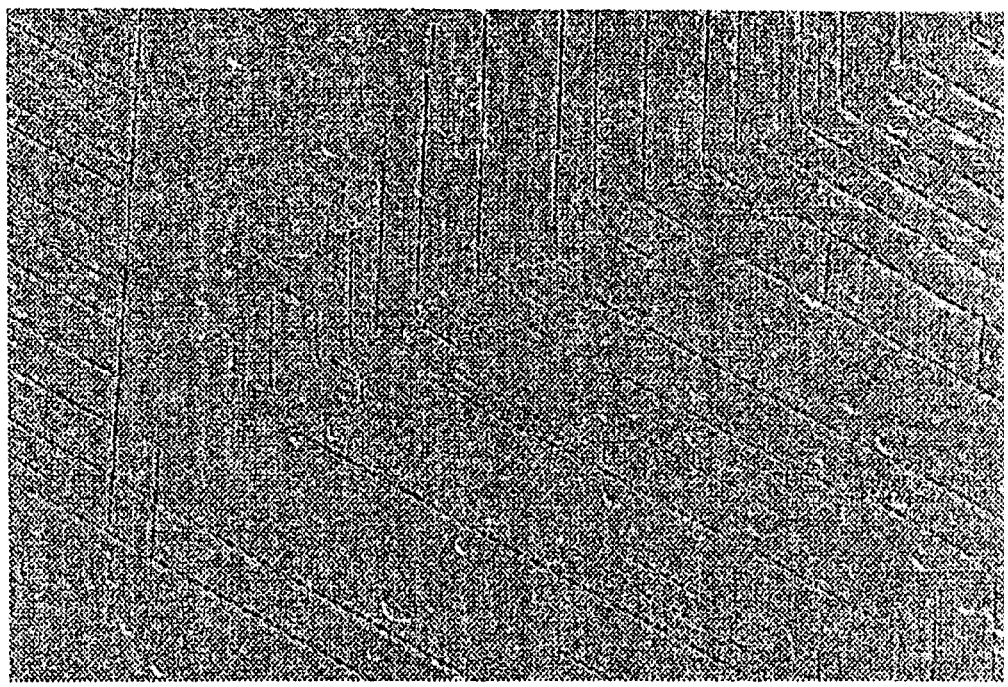
FIG. 6 illustrates cracks of a GaN epitaxy layer due to stress resulted and accumulated due to different lattice constants between the GaN and silicon substrate.
Figure 7:
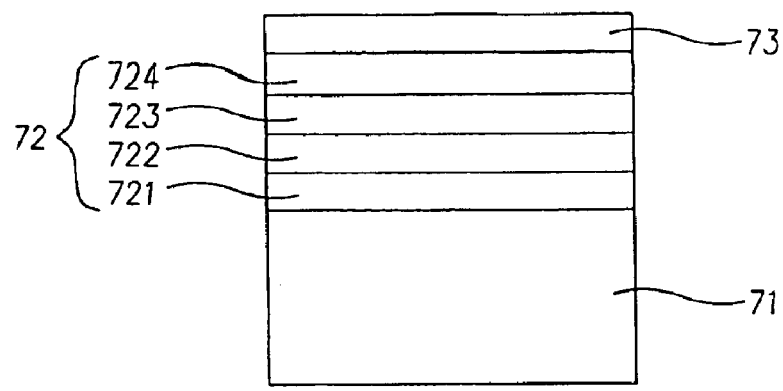
FIG. 7 illustrates a laminar cross-section of a first embodiment of a semiconductor device according this invention.

To overcome the interfacing difficulties existed between the GaN layer and conventional Si substrate, this invention adds a stress-absorbing layer to the above laminar structure consisting of numerous layers of different properties, as shown in FIG. 7, which illustrates a laminar cross-section of a first embodiment of a semiconductor device according this invention. As illustrated, a Si substrate 71 includes a stress-absorbing layer 72 that is constructed of an amorphous silicon nitride layer 721, an aluminum interlayer 722, an amorphous aluminum nitride pre-layer 723 and a polycrystalline Group III nitride layer containing aluminum 724, that are arranged in sequence. The stress-absorbing layer 72 is deposited thereon with a monocrystalline Group III nitride layer 73. The monocrystalline Group III nitride layer 73 constitutes a part of the desired device (not shown). The monocrystalline Group III nitride layer 73 may further be deposited thereon with other monocrystalline Group III nitride layers serving as corresponding electrodes (not shown) of the above desired device.

The amorphous silicon nitride layer 721 that is first deposited on the silicon substrate 71 may be made by being subjected to a nitridation process, in which the thickness and uniformity of the layer 721 is controlled by the quantity and temperature of $N_2$ and $NH_3$ in a reactor. The layer 721 may also be made by the addition of silicon precursor and nitrogen precursor to the silicon substrate 71. The amorphous silicon nitride layer 721 preferably has a thickness of about 3 Å–500 Å, and best preferably of 10 Å–30 Å. The aluminum interlayer 722 deposited on the amorphous silicon nitride layer 721 serves as an interface for guiding formation of Group III nitride substance and preferably has a thickness of about 5 Å–20 Å. During the formation of the aluminum interlayer 722, an aluminum-nitrogen bond is simultaneously established between the aluminum interlayer 722 and the amorphous silicon nitride layer 721, to facilitate subsequent lamination of amorphous aluminum nitride substance. The amorphous aluminum nitride pre-layer 723 subsequently deposited on the aluminum interlayer would rearrange with the aluminum to alleviate stress between the amorphous aluminum nitride substance and the silicon substrate. The pre-layer 723 preferably has a thickness of about 5 Å–500 Å. The polycrystalline Group III nitride layer containing aluminum 724 lastly deposited on the amorphous aluminum nitride pre-layer 723 serves as a buffer layer of the subsequent monocrystalline Group III nitride layer 73, to facilitate growth and to enhance crystallinity of the monocrystalline Group III nitride layer 73.

Figure 8:
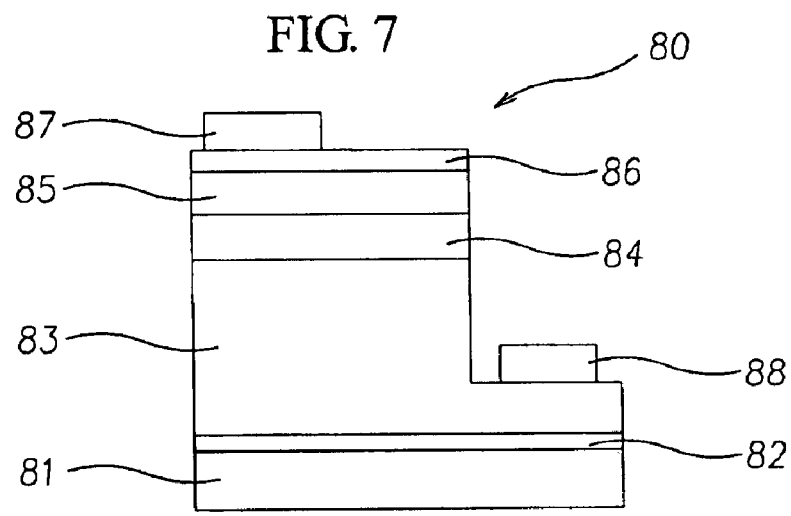
FIG. 8 illustrates a laminar cross-section of a second embodiment of a semiconductor device according this invention.
Figure 9:
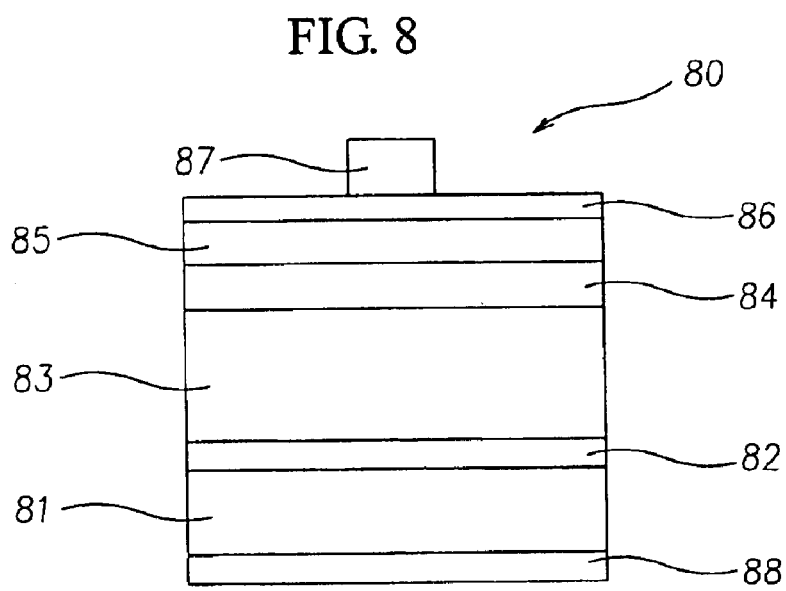
FIG. 9 illustrates a laminar cross-section of a third embodiment of a semiconductor device according this invention.

The Group III nitride device deposited on the silicon substrate may be a light-emitting diode, laser diode, photodiode, miniature electronic device structure or miniature electromechanical device structure, constituted of AlInGaN-like substances. FIG. 8 exemplifies a light-emitting diode (LED) 80 deposited on the silicon substrate 81 and stress-absorbing layer 82. The light-emitting diode 80 includes: an active layer 84 containing a Group III nitride substance (such as InGaN) in the form of homostructure, heterostructure, double-heterostructure, single-quantum well and multiple-quantum well; two conductive layers 83, 85 containing Group III nitrides (such as AlInGaN) having different electrical conductivities and connected to a top and a bottom of the active layer 84, respectively, wherein the n-conductive layer 83 located beneath the light-emitting diode 80 is exposed by etching; a p-type electrode 87 and an n-type electrode 88 deposited on the p- and n-conductive layers 85, 83, which electrodes are formed by electro-plating the conductive layers 83, 85 with Ti/Al or Ti/Au films; and a transparent electrode 86 located between the p-conductive layer 85 and the p-type electrode 87. In addition, the n-type electrode 88 may be deposited on a back side of the silicon substrate 81 if a low resistant silicon substrate is selected to manufacture the Group III nitride semiconductor LED in the beginning, as shown in FIG. 9.

This invention is related to a novel creation that makes a breakthrough in the art. Aforementioned explanations, however, are directed to the description of preferred embodiments according to this invention. Since this invention is not limited to the specific details described in connection with the preferred embodiments, changes and implementations to certain features of the preferred embodiments without altering the overall basic function of the invention are contemplated within the scope of the appended claims.

What is claimed is:

1. A Group III nitride semiconductor device, comprising:
   a monocrystalline silicon substrate;
   a stress-absorbing layer located on the silicon substrate, having:
   a stress-absorbing layer with an amorphous silicon nitride layer deposited on the silicon substrate;
   an aluminum interlayer deposited on the amorphous silicon nitride layer;
   an amorphous aluminum nitride pre-layer deposited on the aluminum interlayer; and
   a polycrystalline Group III nitride layer containing aluminum, deposited on the amorphous aluminum nitride pre-layer; and
   a monocrystalline Group III nitride semiconductor device laminar structure, deposited on the polycrystalline Group III nitride layer containing aluminum.

2. The Group III nitride semiconductor device according to claim 1, wherein the monocrystalline silicon substrate is a low resistant silicon substrate.

3. The Group III nitride semiconductor device according to claim 1, wherein the amorphous silicon nitride layer is made by a nitridation process.

4. The Group III nitride semiconductor device according to claim 1, wherein the amorphous silicon nitride layer has a thickness of about 3 Å–500 Å.

5. The Group III nitride semiconductor device according to claim 1, wherein the, amorphous silicon nitride layer has a thickness of about 10 Å–30 Å.

6. The Group III nitride semiconductor device according to claim 1, wherein the aluminum interlayer has a thickness of about 5 Å–20 Å.

7. The Group III nitride semiconductor device according to claim 1, wherein the aluminum interlayer and the amorphous silicon nitride layer are formed with an aluminum-nitrogen bond therebetween.

8. The Group III nitride semiconductor device according to claim 1, wherein the amorphous aluminum nitride pre-layer has a thickness of about 5 Å–500 Å.

9. The Group III nitride semiconductor device according to claim 1, wherein the amorphous aluminum nitride pre-layer rearranges with the aluminum interlayer during formation to alleviate stress between the amorphous aluminum nitride pre-layer and the silicon substrate.

10. The Group III nitride semiconductor device according to claim 1, wherein the polycrystalline Group III nitride layer containing aluminum serves to function as a buffer layer of the monocrystalline Group III nitride layer.

11. The Group III nitride semiconductor device according to claim 1, wherein the semiconductor device is selected from one of the group consisting of: light-emitting diodes, laser diodes, photodiodes, miniature electronic device structures and miniature electromechanical device structures.

12. The Group III nitride semiconductor device according to claim 1, wherein the monocrystalline Group III nitride semiconductor device laminar structure further comprises:
   an active layer;
   a first Group III nitride conductive layer, located between the active layer and the stress-absorbing layer; and
   a second Group III nitride conductive layer, located on the active layer, having an electrical conductivity different from an electrical conductivity of the Group III nitride conductive layer.

13. The Group III nitride semiconductor device according to claim 12, the monocrystalline Group III nitride semiconductor device laminar structure further comprises a first electrode, located on the second Group III nitride conductive layer.

14. The Group III nitride semiconductor device according to claim 13, wherein the first electrode is made by etching part of the Group III nitride conductive layer.

15. The Group III nitride semiconductor device according to claim 12, wherein the monocrystalline Group III nitride semiconductor device laminar structure further comprises a first electrode, located beneath the silicon substrate.

16. The Group III nitride semiconductor device according to claim 12, wherein the monocrystalline Group III nitride semiconductor device laminar structure further comprises a transparent electrode, located on the first Group III nitride conductive layer.

17. The Group III nitride semiconductor device according to claim 16, wherein the monocrystalline Group III nitride semiconductor device laminar structure further comprises a first electrode, located on the transparent electrode.

18. The Group III nitride semiconductor device according to claim 17, wherein the electrode is made of a material selected from one of the group consisting of: Ti/Al and Ni/Au.

19. The Group III nitride semiconductor device according to claim 12, wherein the active layer is of a structure selected from one of the group consisting of: homostructure, heterostructure, double-heterostructure, single-quantum well and multiple-quantum well.

20. A method of manufacturing a Group III nitride semiconductor device, comprising the steps of:
   depositing a monocrystalline silicon substrate;
   depositing an amorphous silicon nitride layer on the silicon substrate;
   depositing an aluminum interlayer on the amorphous silicon nitride layer;
   depositing an amorphous aluminum nitride pre-layer on the aluminum interlayer;
   depositing a polycrystalline Group III nitride layer containing aluminum on the amorphous aluminum nitride pre-layer; and
   depositing a monocrystalline Group III nitride semiconductor device laminar structure on the polycrystalline Group III nitride layer containing aluminum.

21. The method of manufacturing a Group III nitride semiconductor device according to claim 20, wherein the monocrystalline silicon substrate is a low resistant silicon substrate.

22. The method of manufacturing a Group III nitride semiconductor device according to claim 20, wherein the amorphous silicon nitride layer is made by a nitridation process.

23. The method of manufacturing a Group III nitride semiconductor device according to claim 20, wherein the amorphous silicon nitride layer has a thickness of about 3 Å–500 Å.

24. The method of manufacturing a Group III nitride semiconductor device according to claim 20, wherein the, amorphous silicon nitride layer has a thickness of about 10 Å–30 Å.

25. The method of manufacturing a Group III nitride semiconductor device according to claim 20, wherein the aluminum interlayer has a thickness of about 5 Å–20 Å.

26. The method of manufacturing a Group III nitride semiconductor device according to claim 20, wherein the aluminum interlayer and the amorphous silicon nitride layer are formed with an aluminum-nitrogen bond therebetween.

27. The method of manufacturing a Group III nitride semiconductor device according to claim 20, wherein the amorphous aluminum nitride pre-layer has a thickness of about 5 Å–500 Å.

28. The method of manufacturing a Group III nitride semiconductor device according to claim 20, wherein the amorphous aluminum nitride pre-layer rearranges with the aluminum interlayer during formation to alleviate stress between the amorphous aluminum nitride pre-layer and the silicon substrate.

29. The method of manufacturing a Group III nitride semiconductor device according to claim 20, wherein the polycrystalline Group III nitride layer containing aluminum serves to function as a buffer layer of the monocrystalline Group III nitride layer.

30. The method of manufacturing a Group III nitride semiconductor device according to claim 20, wherein the semiconductor device is selected from one of the group consisting of: light-emitting diodes, laser diodes, photodiodes, miniature electronic device structures and miniature electromechanical device structures.

31. The method of manufacturing a Group III nitride semiconductor device according to claim 20, wherein the monocrystalline Group III nitride semiconductor device laminar structure is formed by the steps of:

depositing an active layer;

depositing a first Group III nitride conductive layer located between the active layer and the stress-absorbing layer; and depositing a second Group III nitride conductive layer located on the active layer and having an electrical conductivity different from an electrical conductivity of the Group III nitride conductive layer.

32. The method of manufacturing a Group III nitride semiconductor device according to claim 31, wherein the step of depositing the monocrystalline Group III nitride semiconductor device laminar structure further comprises the step of: depositing a first electrode on the second Group III nitride conductive layer.

33. The method of manufacturing a Group III nitride semiconductor device according to claim 32, wherein the first electrode is made by etching part of the Group III nitride conductive layer.

34. The method of manufacturing a Group III nitride semiconductor device according to claim 31, wherein the step of depositing the monocrystalline Group III nitride semiconductor device laminar structure further comprises the step of: depositing a first electrode beneath the silicon substrate.

35. The method of manufacturing a Group III nitride semiconductor device according to claim 31, wherein the step of depositing the monocrystalline Group III nitride semiconductor device laminar structure further comprises the step of: depositing a transparent electrode on the first Group III nitride conductive layer.

36. The method of manufacturing a Group III nitride semiconductor device according to claim 35, wherein the step of depositing the monocrystalline Group III nitride semiconductor device laminar structure further comprises the step of: depositing a first electrode on the transparent electrode.

37. The method of manufacturing a Group III nitride semiconductor device according to claim 36, wherein the electrode is made of a material selected from one of the group consisting of: Ti/Al and Ni/Au.

38. The method of manufacturing a Group III nitride semiconductor device according to claim 31, wherein the active layer is of a structure selected from one of the group consisting of:

homostructure, heterostructure, double-heterostructure, single-quantum well and multiple-quantum well.

* * * * *